(12) United States Patent
De Volder et al.

(10) Patent No.: US 9,266,267 B2
(45) Date of Patent: Feb. 23, 2016

(54) METHOD OF MANUFACTURING A SENSOR

(71) Applicant: Continental Teves AG & Co. oHG, Frankfurt (DE)

(72) Inventors: Edmond De Volder, Sint-Niklaas (BE); Dietmar Huber, Eichstätt (DE); Andreas Doering, Düsseldorf (DE); Jakob Schillinger, Gaimersheim (DE); Martin Watzlawik, Maintal (DE); Lothar Biebricher, Oberursel (DE)

(73) Assignee: Continental Teves AG & Co. oHG (DE)

( * ) Notice: Subject to any disclaimer, the term of this patent is extended or adjusted under 35 U.S.C. 154(b) by 374 days.

(21) Appl. No.: 13/780,731

(22) Filed: Feb. 28, 2013

(65) Prior Publication Data
US 2013/0175733 A1 Jul. 11, 2013

Related U.S. Application Data

(62) Division of application No. 13/121,542, filed as application No. PCT/EP2009/062752 on Oct. 1, 2009, now Pat. No. 9,061,454.

(30) Foreign Application Priority Data

Oct. 2, 2008 (DE) .......................... 10 2008 049 958
Dec. 19, 2008 (DE) .......................... 10 2008 064 047

(51) Int. Cl.
*H05K 3/30* (2006.01)
*B29C 45/14* (2006.01)
(Continued)

(52) U.S. Cl.
CPC ......... *B29C 45/14065* (2013.01); *B29C 33/126* (2013.01); *B29C 45/1671* (2013.01);
(Continued)

(58) Field of Classification Search
CPC ..................... H01L 21/52; H05K 2201/10151; H05K 2201/0999; H05K 5/0034; Y10T 29/49121; Y10T 29/4921
USPC ........................... 29/841, 827, 831, 835, 848
See application file for complete search history.

(56) References Cited

U.S. PATENT DOCUMENTS 5,006,797 A  4/1991 Smith
5,429,735 A  7/1995 Johnson et al.
(Continued)

FOREIGN PATENT DOCUMENTS

DE  4111568 A1  10/1992
DE  10333035 A1  2/2005
(Continued)

OTHER PUBLICATIONS

Amesoeder, S. et al: "Plasma Sorgt Fuer Festen Verbund", Kunstoffe, Carl Hanser Verlag, Munchen, DE, Bd. 93, Nr. 9, Jan. 2003. Seiten 124-129, XP001171704, ISSN: 0023-5563.
(Continued)

*Primary Examiner* — Thiem Phan
(74) *Attorney, Agent, or Firm* — RatnerPrestia

(57) ABSTRACT

A method for manufacturing a sensor in which a sensor element, which comprises at least a first housing, is at least partially encapsulation-molded in an encapsulation-molding process. As a result of the encapsulation-molding process a sensor housing is formed. The sensor element is mechanically connected to a support element and/or accommodated by the support element, after which the sensor element and the support element are encapsulation-molded in a common encapsulation-molding process for forming the sensor housing.

6 Claims, 6 Drawing Sheets

(51) Int. Cl.
*B29C 33/12* (2006.01)
*B29C 45/16* (2006.01)
*G01D 11/24* (2006.01)
*G01P 1/02* (2006.01)

(52) U.S. Cl.
CPC .............. *G01D11/245* (2013.01); *G01P 1/026* (2013.01); *B29C 45/14655* (2013.01); *H01L 2224/32245* (2013.01); *H01L 2224/45144* (2013.01); *H01L 2224/48091* (2013.01); *H01L 2224/48137* (2013.01); *H01L 2224/48247* (2013.01); *H01L 2224/48257* (2013.01); *H01L 2224/73265* (2013.01); *Y10T 29/4921* (2015.01); *Y10T 29/49121* (2015.01)

(56) References Cited

U.S. PATENT DOCUMENTS

| | | | |
|---|---|---|---|
| 5,440,153 | A | 8/1995 | Male et al. |
| 5,542,171 | A | 8/1996 | Juskey et al. |
| 5,909,633 | A | 6/1999 | Haji et al. |
| 5,953,108 | A | 9/1999 | Falb et al. |
| 5,998,989 | A | 12/1999 | Lohberg |
| 6,334,361 | B1 | 1/2002 | De Volder et al. |
| 6,844,214 | B1 | 1/2005 | Mei et al. |
| 7,408,344 | B2 | 8/2008 | Tokuhara |
| 2003/0033875 | A1 | 2/2003 | Iijima et al. |
| 2004/0080314 | A1 | 4/2004 | Tsujii et al. |
| 2004/0232906 | A1 | 11/2004 | Taneyhill |
| 2005/0115317 | A1 | 6/2005 | Fouquet |
| 2005/0179557 | A1 | 8/2005 | Matsumoto et al. |
| 2005/0275141 | A1 | 12/2005 | Lange |
| 2006/0118239 | A1 | 6/2006 | Condrashoff et al. |
| 2006/0171127 | A1 | 8/2006 | Kadoya et al. |
| 2007/0120555 | A1 | 5/2007 | Tokuhara |
| 2007/0195331 | A1 | 8/2007 | Bain et al. |
| 2007/0262249 | A1 | 11/2007 | Lee et al. |
| 2008/0105988 | A1 | 5/2008 | Haag |
| 2009/0061555 | A1 | 3/2009 | Nagano |
| 2009/0212285 | A1 | 8/2009 | Nishi et al. |
| 2010/0175921 | A1 | 7/2010 | Büyükbas et al. |

FOREIGN PATENT DOCUMENTS

| | | |
|---|---|---|
| DE | 10333197 A1 | 2/2005 |
| DE | 102004062087 A1 | 4/2006 |
| DE | 102004060297 A1 | 6/2006 |
| DE | 102007037910 A1 | 4/2008 |
| DE | 202007002582 U1 | 8/2008 |
| DE | 102007046304 A1 | 4/2009 |
| EP | 1262779 A2 | 12/2002 |
| EP | 1811566 A2 | 7/2007 |
| FR | 2864700 A1 | 7/2005 |
| JP | 2000108205 A | 4/2000 |
| JP | 2000206130 A | 7/2000 |
| WO | WO95/17680 | 6/1995 |
| WO | WO97/36729 | 10/1997 |
| WO | WO2006/063884 | 6/2006 |
| WO | WO2007/123310 | 11/2007 |
| WO | WO2008/031657 | 3/2008 |
| WO | WO2008/113336 A2 | 9/2008 |

OTHER PUBLICATIONS

US Office Action for U.S. Appl. No. 13/121,494, filed Feb. 14, 2014.
US Office Action for U.S. Appl. No. 13/121,542, filed Jun. 26, 2014.
US Office Action for U.S. Appl. No. 13/121,542, filed Oct. 15, 2013.

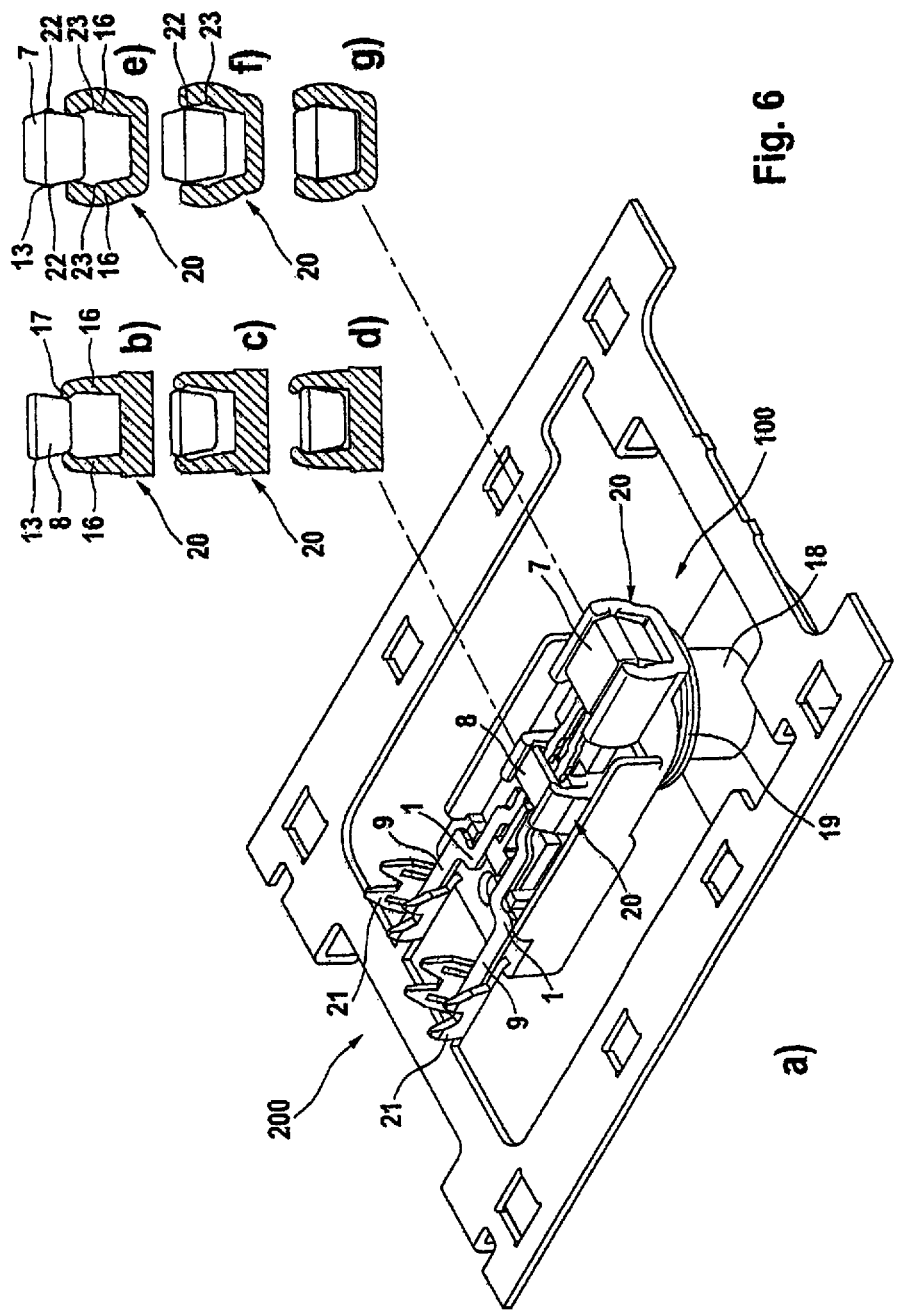

METHOD OF MANUFACTURING A SENSOR

CROSS REFERENCE TO RELATED APPLICATIONS

This application is a Divisional application of U.S. application Ser. No. 13/121,542 filed Mar. 29, 2011 which is a U.S. National Phase Application of PCT International Application No. PCT/EP2009/062752, filed Oct. 1, 2009, which claims priority to German Patent Application No. 10 2008 049 958.7, filed Oct. 2, 2008 and German Patent Application No. 10 2008 064 047.6, filed Dec. 19, 2008, the contents of such applications being incorporated by reference herein.

FIELD OF THE INVENTION

The invention relates to a sensor element, a support element for holding a sensor element, a method for manufacturing a sensor and the use of the sensor element and of the support element in motor vehicles.

BACKGROUND OF THE INVENTION

Printed document WO 95/17680, which is incorporated by reference, proposes a wheel speed sensor with a lead frame which is fitted with components on both sides and has a housing with a probe element and an electronic circuit, arranged on one side of the lead frame, and a magnet arranged on the other side of the lead frame.

In printed document WO 97/36729, which is incorporated by reference, a method for manufacturing a wheel speed sensor is proposed which comprises a first housing part which has positioning elements with integrated fusible ribs, this first housing part being enclosed by a second housing part in a plastic injection molding process.

One of the objects of the invention is to provide for a simple manufacturing of a sensor which is formed in a tight and dimensionally stable manner.

SUMMARY OF THE INVENTION

According to aspects of the invention, this and other objects are achieved by the sensor element, the support element and by the method for manufacturing described herein.

The sensor element preferably comprises a first housing which is connected to a basic element.

A basic element is preferably understood to be a lead frame and/or a structural element of the sensor element and/or a carrier strip/carrier film or an MID element (Molded Interconnect Device) element (injection molded circuit carrier), which comprises a plastic body or an injection molded body, respectively, which has conductor tracks applied to it and/or enclosed by it which, for example, are formed from metal and/or from a conductive plastic.

The holding device is preferably formed so as to be embraceable from the outside.

The holding device preferably has a rounded embraceable edge.

It is preferred that at least one holding device, especially the holding device of the first housing, has at least one locating nose or locating edge, preferably at least one locating nose or locating edge on, in each case, two opposite outer surfaces of the corresponding housing, more preferably, in each case, two mutually spaced-apart locating noses on, in each case, two opposite outer surfaces of the corresponding housing.

The holding device is preferably part of a first housing and is integrally connected to it, the first housing being connected directly or indirectly to the basic element.

The first housing preferably comprises at least the probe element and/or an electronic signal processing circuit.

The sensor element may additionally have a second housing, which likewise comprises a holding device which is embraceable from the outside. The second housing may consist of plastic, of epoxy for example, and encloses a part of the lead frame or of the carrier strip or of the basic element, respectively. The second housing encloses, preferably, an electronic protection element such as, for example, a capacitor or a Zener diode or a varistor which is electrically connected to the basic element. An advantage of the second housing can be seen in a mechanical force decoupling of the electric contact arrangements or bonding wires, especially of the probe element and of the signal processing circuit, with the basic element. Forces arise during the processing of the sensor element during bending, clipping-in, contacting. In addition, the second housing of the sensor element provides for more accurate positioning of the sensor element into the support element by the second clipping-in point and a more position-oriented locating of the sensor element in the support element during the later common encapsulation.

The first and/or the second housing of the sensor element preferably have on, in each case, two opposite outer surfaces, in each case, at least one holding device. These holding devices, in each case, protrude from the housing especially axially with respect to the basic element.

The first and/or second housing of the sensor element is preferably formed from plastic, especially from epoxy.

The basic element or the lead frame, respectively, of the sensor element suitably has contacting legs, by means of which the sensor element and/or the sensor can be electrically connected to an external system.

The support element is preferably developed by being formed at least partially from plastic, more preferably from thermoplastic, the at least one clamping device and the positioning element especially being designed for positioning in an injection molding tool made of plastic.

The support element suitably has two clamping devices, into which, especially in each case, a housing and/or a holding device of the sensor element is clipped or is attached to it.

It is preferred that the support element has fusible ribs which are allocated to the positioning element. In this context, these fusible ribs are integrated into the positioning element.

The support element suitably comprises a metal frame and a support element connected to it which comprises the positioning element and the at least one clamping device. The metal frame especially has one or more connecting elements to at least one further support element or to its metal frame. The metal frame is suitably removed before the joint encapsulation of the support element and of the sensor element. This removal may take place during or after a crimping process, in which contact terminals of the support element are in each case jointly electrically conductively connected to at least one contact leg of the sensor element and one contacting element of an external connecting cable or of an external plug, that is to say, for example, to a corresponding cable strand or a plug pin/terminal, that is to say, for example, crimped or welded or soldered or bonded.

It is advantageous that the at least one clamping device comprises two flexible legs which can accommodate or hold a holding device of the sensor element essentially positively by means of a clipping-in and/or locking-in process. The two legs in this arrangement have especially at their ends or heads in each case a rounded portion for easier accommodation of the holding device of the sensor element. The ends or heads of at least one leg have preferably a slot or a groove for accommodating a holding device, correspondingly formed to fit, of the sensor element.

The two legs of the at least one clamping device suitably comprise in each case a groove on the inside of the leg, especially for accommodating or locking in each case a locating nose or locating edge of the holding device of the sensor element.

The support element, especially its basic element or lead frame, preferably has at least two electric contact terminals which are formed to be "crimpable" and/or basket-shaped and can in each case embrace at least partially an external connecting contact such as, for example, a cable strand or a plug pin/terminal and a contact leg or contacting leg of the sensor element, as a result of which a mechanically firm, electrically conductive connection is produced. As an alternative, the contact terminals of the support element are essentially formed to be plane and jointly welded to in each case a contacting leg of the sensor element and a strand or a plug pin/terminal of an external connection.

The holding device of the sensor element and the clamping device of the support element are preferably formed in such a manner that they can be positively connected to one another and thus provide for an attachment of the sensor element to the support element.

The encapsulation-molding process for forming the sensor housing or the common encapsulation-molding process of sensor element and support element is preferably carried out as over molding-injection molding process.

An overmolding-injection molding process is preferably understood to be an injection molding process in which a thermoplastic is pressed into an external mold, for example a customer-specific external mold, especially by means of a worm drive. Preferably, a viscous molding material, for example polyamide, is pressed via an extruder worm into the injection mold or mold cavity, after which the thermoplastic material solidifies by cooling at the injection-mold wall. After that, the completed injection-molded component is taken from the tool.

The sensor element is preferably inserted and/or clipped and/or pressed into at least one clamping device of the support element by means of at least one holding device which can be embraced from the outside, before the common encapsulation molding process.

The support element is preferably positioned and/or mounted in an injection molding tool by means of at least one positioning element after being connected to the sensor element.

Before being connected to the support element, the sensor element is preferably manufactured by at least parts of the sensor element being subjected to at least one plasma treatment process during manufacture of said sensor element.

It is possible to use different methods of generating plasmas for plasma treatment such as, for example, the application of high-frequency alternating voltages to a gas or the relevant use of direct current and/or the excitation of a gas by means of microwaves. Exemplary gas mixtures for plasma treatment contain oxygen, argon, hydrogen and/or nitrogen. The type of mixture depends on the special requirements of the plasma treatment process which, for example, are the result of the type of contamination and the material treated. Depending on the type of gas mixture, the plasma has an oxidizing or reducing or activating effect. Oxidizing plasmas are suitable for removing organic contaminations, whilst reducing plasmas are also suitable for removing inorganic deposits and/or reducing oxide deposits.

The plasma treatment process preferably comprises a plasma cleaning process and/or a plasma activation process.

A plasma cleaning process is preferably understood to be a dry, contactless, chemical and/or physical non-abrasive cleaning method by means of which very high cleaning qualities can be achieved. In some embodiments, organic impurities are converted, for example, into water vapor, carbon dioxide and/or $CH_4$ via chemical reaction with free radicals of the plasma. For chemically removing contamination, the plasma contains, for example, oxygen or hydrogen or argon. In this context, oxygen is suitable for removing organic contaminations and hydrogen is suitable for removing inorganic and/or organic substances and for reducing oxides. The cleaning process is suitably a combination of a physical and a chemical action process or alternatively preferably exclusively a chemical action process (ion-free).

Physical: if, for example, the article to be cleaned is connected to a cathode for plasma generation, positive ions from the plasma are accelerated in the direction thereof due to the electrical field applied. On impact, these ions detach atoms and molecules from the surface as a result of direct pulse transfer.

Chemical: excited oxygen and oxygen ions form carbon dioxide, for example during the reaction with hydrocarbons. Excited hydrogen forms, for example, halides, sulfides, $CH_x$, especially $CH_4$, and water vapor.

A plasma activation process is preferably understood to be a plasma treatment process for increasing the surface tension or adhesion of the body to be treated or to be activated, respectively. In this context, the adhesion between a substrate or the body, respectively, is reinforced by means of a material to be applied, for example molding material. The substrate or this body, respectively, can thus be wetted or adhesively wrapped more easily by an especially fluid means or substance. In this context, the contact angle of a drop on the body is an established measure of the surface tension of the body. If the surface of the body is hydrophobic, it has a low surface tension. By means of a plasma activation process, as with a bonding agent, an increase in surface tension is achieved. The surface of the body is hydrophilic, or easily wettable, after the plasma activation process, the contact angle is reduced and the inclination to delamination is less. A plasma activation process is used, for example, for improving the adhesion of adhesives or coatings on particular plastics.

The method suitably comprises a plasma cleaning process before a contacting process for markedly reducing susceptibility to corrosion and a plasma activation process before an encapsulation molding process for markedly reducing the susceptibility to delamination.

The sensor element is preferably equipped with at least one probe element and/or at least one electronic circuit which are arranged directly or indirectly on the basic element or the lead frame, respectively, preferably on a support base or on a die pad of the basic element. The probe element and/or the electrical circuit are preferably electrically contacted in accordance with a ball-stitch-on-ball bonding method or a stitch-on-bump bonding method (SOB), as a result of which a high tensile and shearing strength of the electrical contact arrangements can be achieved. As an alternative, the probe element and/or the electrical circuit are more preferably electrically contacted in accordance with a wedge-ball bonding method or in accordance with a reverse-stitch-on-ball bonding method (RSOB).

The sensor element, especially the basic element and optionally other components of the sensor element, are preferably subjected to a plasma treatment process, such as a plasma cleaning process, before an assembly process and/or before a contacting process with electrical connecting means.

Before an encapsulation molding process for manufacturing at least the first housing of the sensor element, at least parts of the sensor element are subjected to a plasma treatment process, such as a plasma activation process.

Before at least an encapsulation molding process, especially a plastic injection molding process, at least parts of the sensor element, preferably the first and second housings, are preferably subjected to a plasma treatment process, especially a plasma activation process. This is carried out more preferably in accordance with at least one assembly process.

A probe element is preferably understood to be a magnetoelectric transducer element, especially an AMR, GMR or another magnetoresistive element or a Hall element, which preferably has a bridge structure and is also called a bridge die. The probe element suitably has combined magnetoelectric transducer elements of different action.

The basic element or the lead frame, respectively, is preferably fitted with in each case at least one component on both sides.

The probe element and at least a part of the basic element are preferably encapsulation molded, as a result of which the first housing of the sensor element is formed. In addition, at least a part of the basic element, preferably an electronic protection element, is encapsulation-molded, as a result of which the second housing of the sensor element is formed. In this arrangement, the first and second housings preferably have a defined distance from one another.

During the encapsulation molding process for manufacturing the sensor or for forming the sensor housing, respectively, the first and the second housing of the sensor element are suitably encapsulation molded jointly.

It is preferred that, especially at the end of the manufacturing process for the sensor element and/or for the sensor, the sensor element or the sensor is subjected to an additional plasma treatment process, especially a plasma cleaning process, as a result of which the exposed contacts or connecting means of the sensor element or of the sensor, respectively, corrode or tend to corrode only to a relatively small extent, if at all. In addition, due to the plasma cleaning process, a galvanizing process, for example tin-plating or nickel-plating for protecting the exposed contacts or connecting means, can be omitted. The sensor element and/or the sensor are subsequently preferably packaged directly in an air-tight manner.

The method for manufacturing the sensor element preferably comprises the following steps:

Stamping a basic element out of a blank which may be formed from a metal plate or using a carrier strip/carrier foil or an MID element therefore basic element. Subsequently, a surface coating and/or at least one contact point is applied to at least one side of the basic element. Following this, the basic element is fitted with at least one electronic component.

It is preferred that, during the assembly of the basic element of the sensor element, initially a first side or a first face of the basic element is provided with a first adhesive (dispense). This first adhesive is optionally electrically conductive or insulating and has a relatively good thermal conductivity. After that, at least one electronic circuit, also called ASIC die, and/or at least one probe element, which preferably is formed as a bridge, is mounted on this first side. The ASIC die is preferably used as assembly carrier for the probe element. In this context, the probe element is arranged on the ASIC die, for example by means of a flip-chip assembly.

The ASIC die and the probe element are suitably formed as one integrated component.

After that, the adhesive or the basic element and the components, respectively, are heated on the first side of the lead frame, as a result of which the connection is cured by means of the first adhesive.

After that, the basic element or the lead frame, respectively, is suitably subjected to a plasma treatment process, especially a plasma cleaning process, as a result of which the surface of the basic element and of the components is cleaned at least partially of corrosion-promoting sulfide, halogen and/or carbon contaminations. In addition, there is a reduction of the oxide layer. This is advantageous for ensuring reliable electrical contact arrangements between bonding wires and the lead frame or the basic element, respectively, and/or with at least one contact point of the ASIC die or probe element. In addition, this cleaning is used for achieving a relatively great sealing effect in the course of an at least partial encapsulation molding of the lead frame or of the basic element, respectively.

After the assembly of the lead frame or of the basic element, respectively, of a corresponding assembly process and especially after a subsequent plasma treatment process, at least the ASIC die and/or the probe element are preferably electrically conductively connected to one another and/or to the lead frame or basic element by means of a wire bonding process. In this context, solder bumps are preferably firstly applied in a suitable manner at all contact points on the basic element and on contacting pads or on contacting means of the corresponding components. After that, the respective bonding wires are drawn, this being carried out in accordance with the so-called ball-stitch-on-ball bonding method (BSOB) or stitch-on-bump bonding method (SOB). More preferably, the bonding wires which have contact with the ASIC die are drawn away from the contacting pads of the ASIC die to the respective target point and the local bump of the electrical connection. Due to this type of bonding process, undesirable thermal and mechanical influences on the components are kept relatively low. As an alternative, the electrical contacting of the ASIC die and/or of the probe element is carried out by means of a wedge-ball bonding method or a reverse-stitch-on-ball bonding method.

During the contacting, at least one, especially several, of the abovementioned bonding methods is carried out for contacting various electrical contacts. Preferably, the electronic components are contacted by means of the stitch-on-bump bonding method (SOB) and the basic element or lead frame by means of the wedge-ball bonding method or another wedge bonding method. As an alternative, all electrical contacting operations are preferably carried out by means of the stitch-on-bump bonding method (SOB) or (BSOB).

The contacting pad of the ASIC die is suitably formed at least partially of aluminum and/or the contacting pad of the probe element of gold. The contacting pad of the ASIC die of aluminum may be formed as metallization having a thickness of less than 1 µm.

The bonding wire used is preferably gold wire, which has palladium as additive or is doped with small amounts of palladium.

The contact arrangements proposed above provide for high thermal endurance, especially for temperatures up to 180° C., for example for use in motor vehicles, and for a high tensile and shearing strength.

Subsequently, a second adhesive is suitably applied on a second side, opposite the first side, of the basic element or lead frame. After that, a magnetic means, especially a ferrite, is arranged on the second side in the area opposite the bridge in such a manner that the center of gravity of the magnet is located preferably perpendicularly with respect to the basic element essentially above the center of gravity and/or the geometric center of the sensitive face of the probe element. More preferably, an electronic protection element is additionally arranged at a defined distance from the ASIC die optionally on the first side or the second side of the basic element. This protection element is suitably mounted on the same bond pad as the ASIC die or alternatively preferably on another point on the basic element at a defined distance from the ASIC die, and the protection element is mechanically and electrically connected to two contacting legs of the basic element in this arrangement. The latter offers the advantage that the mechanical stability of the connecting pins to the molded housing is improved. In this arrangement, the protection element is suitably surrounded by the second housing.

The second adhesive is preferably formed so as to be electrically conductive.

The first and the second adhesive are preferably dispensed in a punctiform manner or as intersecting lines, in such a manner that after the assembly process or die attachment, the corners of the respective component are adequately covered with adhesive.

Subsequently, the second adhesive is suitably likewise cured by heating.

The heating may be carried out in each case suitably in a furnace.

The electronic protection element is preferably formed as capacitor or alternatively preferably as double Zener diode or varistor. Electrical contacting is carried out via adhesive bonding or the wire bonding technique.

The first and/or second housing of the sensor element is preferably manufactured by means of an encapsulation molding process called transfer molding.

Transfer molding is preferably understood to be an injection molding process in which a solid and/or premixed molding material is liquefied at an increased pressure and increased temperature and subsequently conducted into an injection mold, especially at increased pressure, in which injection molding process the molding material solidifies or crystallizes out to form a thermosetting body, this thermosetting body essentially no longer being fusible.

It is appropriate that after the complete assembly of the basic element of the sensor element or immediately before the transfer molding, respectively, an additional plasma treatment process is carried out. This additional plasma treatment process comprises especially a plasma cleaning process and a plasma activation process thereafter. In this context, the plasma activation process relates preferably to the ASIC die, adhesive and ferrite surfaces, as a result of which better adhesion of the molding material or injection molding material, respectively, is made possible. As a result of these plasma treatment processes, an additional electroplating process, otherwise normally used, is saved in a preferred manner.

The ASIC die, the probe element and the magnetic means are suitably jointly encapsulation molded, as a result of which a first housing is formed around these components. In addition, the electronic protection element is preferably separately encapsulation molded, as a result of which an additional second housing is formed. The encapsulation molding technique preferably used is transfer molding.

It is preferred that the basic element or the lead frame, respectively, of a sensor element is connected to the basic element/lead frame of other sensor elements via connecting webs essentially in the form of a chain or of a strip.

After the encapsulation molding process, the basic elements are separated, such as by a stamping process.

It is appropriate that the basic element has at least one bonding pad or one carrier base or one die pad, respectively, on which the ASIC die and the probe element are arranged on the first side and the magnetic means is arranged on the second side. In addition, the basic element has at least two contacting terminals which are partly connected to the bonding pad.

After the encapsulation molding and especially separation of the basic elements, the magnetic means is preferably magnetized. Following this, the lead frame is preferably connected electrically conductively to plug terminals or to a cable by crimping and/or welding and/or soldering and/or bonding, in which arrangement the contacting terminals are more preferably connected to the plug or cable.

The ASIC die and the probe element or the bridge die, respectively, preferably have essentially the same height and therefore protrude essentially the same distance from the first side of the basic element. In this arrangement, the ASIC die and the bridge die are arranged spaced apart from one another by a defined length on the first side of the basic element. It has been found that this arrangement is advantageous for the joint encapsulation molding. The defined length between ASIC die and bridge die or this distance, respectively, is preferably formed so as to be greater than 40 μm, in order to provide for the bonding process of these components and the subsequent joint encapsulation molding process without problems.

The basic element or the lead frame, respectively, preferably comprises two or more contacting legs which, may be connected to one another by the second housing and which especially preferably protrude partially out of the third, common housing of the sensor element as contact elements of the sensor element.

In addition, the invention relates to the use of the sensor element and of the support element in motor vehicles, especially as a speed sensor or speed sensor arrangement, preferably as wheel speed sensor.

The method according to aspects of the invention is preferably provided for manufacturing sensors for safety-critical applications. The method is provided for manufacturing speed sensors, preferably for motor vehicles.

Other preferred embodiments are obtained from the subsequent descriptions of exemplary embodiments, referring to the figures.

BRIEF DESCRIPTION OF THE DRAWINGS

The invention is best understood from the following detailed description when read in connection with the accompanying drawings. Included in the drawings is the following figures:

FIG. 6 shows the exemplary connecting or clipping-in between a sensor element and a support element.

DETAILED DESCRIPTION OF THE PREFERRED EMBODIMENTS

Figure 1:
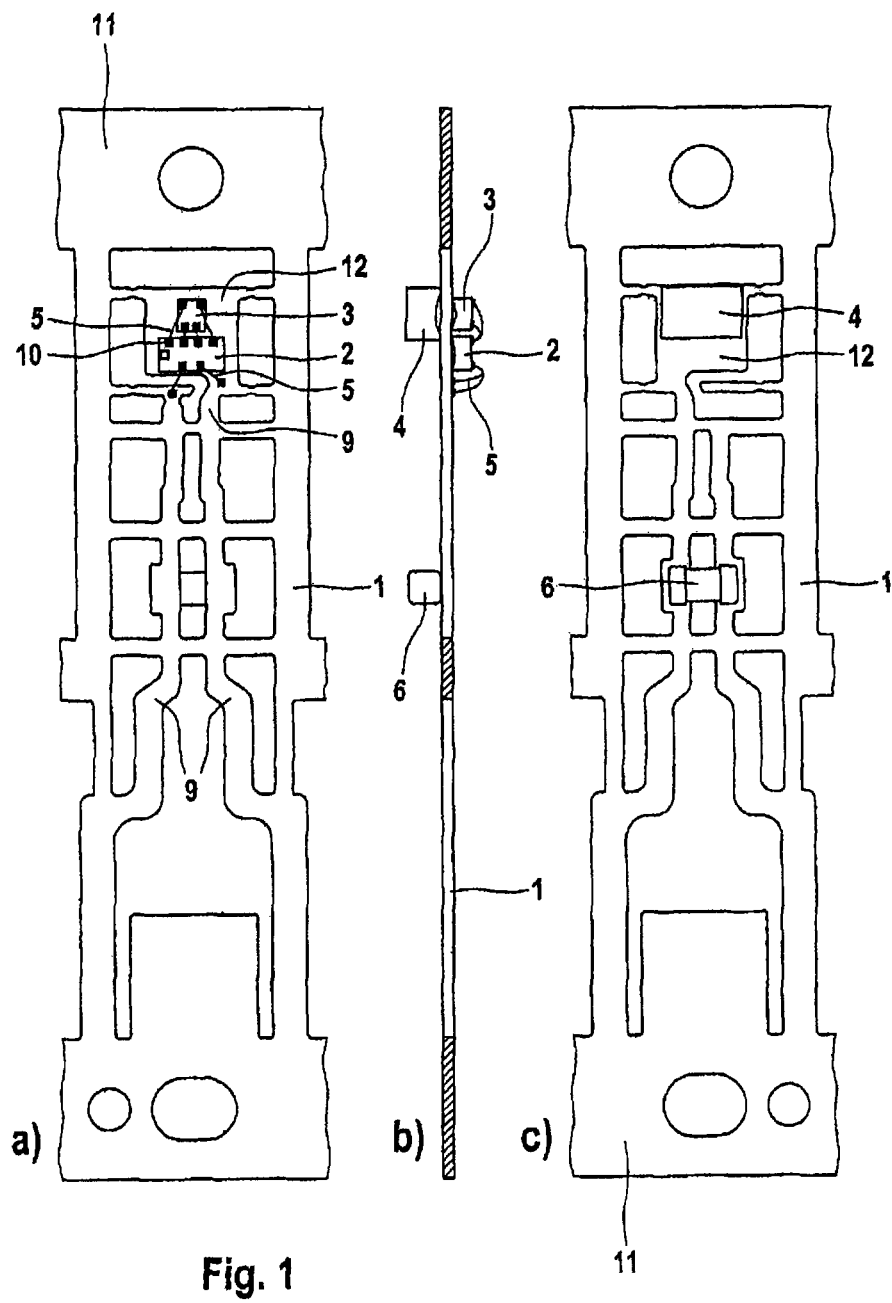
FIG. 1 shows an exemplary embodiment of the sensor element in a manufacturing stage thereof, in which the sensor element does not yet have any holding device.

FIG. 1 shows an exemplary sensor element within a manufacturing stage in which the sensor element does not yet have any holding device for connection to a support element. In this context, FIG. 1a) shows a top view of the first side of the basic element 1, FIG. 1b) shows a side view and FIG. 1c) shows a top view of the second side or the underside of the basic element 1. The basic element 1 is formed as lead frame of metal according to the example.

The first side of the base element 1 is fitted with a probe element 3 and an ASIC die 2, which are connected to one another and to the contacting legs 9 of the basic element 1 by electrical connecting means 5 or bonding wires, also called "wire bonds". The probe element 3 and the ASIC die 2 protrude essentially by an equal distance from the basic element 1 and are formed so as to be equally high. The wiring or electrical contacting is formed in accordance with a ball-stitch-on-ball bonding method according to the example, the AU wires 5 being connected to bonding bumps or gold bumps which are arranged on the contacting legs 9 of the basic element 1 and on contacting pads 10 of the probe element 3 and of the ASIC die 2. In the exemplary embodiment shown in FIG. 1, the sensor element shown is connected with respect to its basic element to other basic elements, not shown, by means of a band 11 or another connection. The probe element 3 and the ASIC die 2 are arranged on a carrier base 12 of the basic element 1.

The carrier base 12 or the bonding pad, respectively, is fitted on the second side of the basic element 1 with a magnetic means 4, which is formed as ferrite. In addition, the second side of the basic element 1 is fitted with an electronic protection element 6, for example formed as capacitor element, which is arranged at a defined distance from the carrier base 12 and from the ASIC die 2, respectively.

Figure 2:
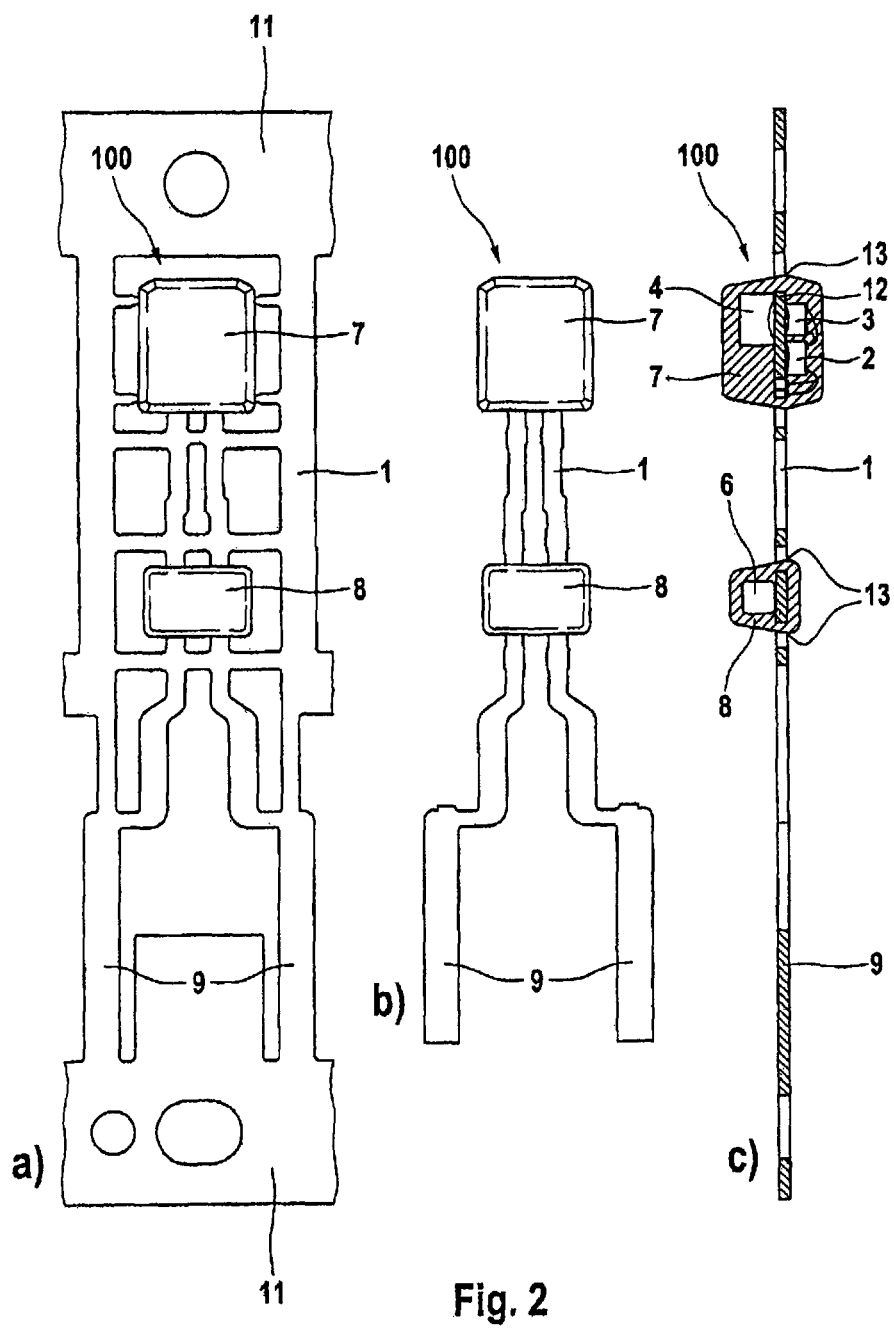
FIGS. 2 and 3 show exemplary sensor elements, which in each case have a holding device at a first and second housing for connection to the support element.

FIG. 2 shows an exemplary embodiment of a sensor element 100 with a first and a second housing 7, 8, which are formed from a thermosetting molding compound, for example from epoxy, in an injection molding process. FIG. 2a) shows the sensor element 100 still connected with respect to its basic element 1 to other sensor elements, not shown, by the band 11. In this arrangement, the basic element 1 has two contacting legs 9 and one carrier base, this carrier base being enclosed by the first housing 7. FIG. 2b) shows the exemplary sensor element 100 after a separation process in which only the part of the basic element 1 which is relevant to the completed sensor element is stamped out and processed further. FIG. 2c) shows a lateral sectional view of this exemplary sensor element 100. From this view, holding devices 13 which are part of the first and second housings 7, 8 can be seen. The holding devices 13 are in each case formed as rounded edge, which can be embraced from the outside, of the first and second housings 7, 8 according to the example. In this arrangement, the first housing 7 contains an ASIC die 2 and a probe element 3, arranged on a first side of the carrier base 12 of the basic element 1, and a magnetic means 4 or, according to the example, a ferrite arranged on the second side of this carrier base 12. The second housing 8 comprises a capacitor element as electronic protection element 6, which is connected to the two contacting legs 9.

Figure 3:
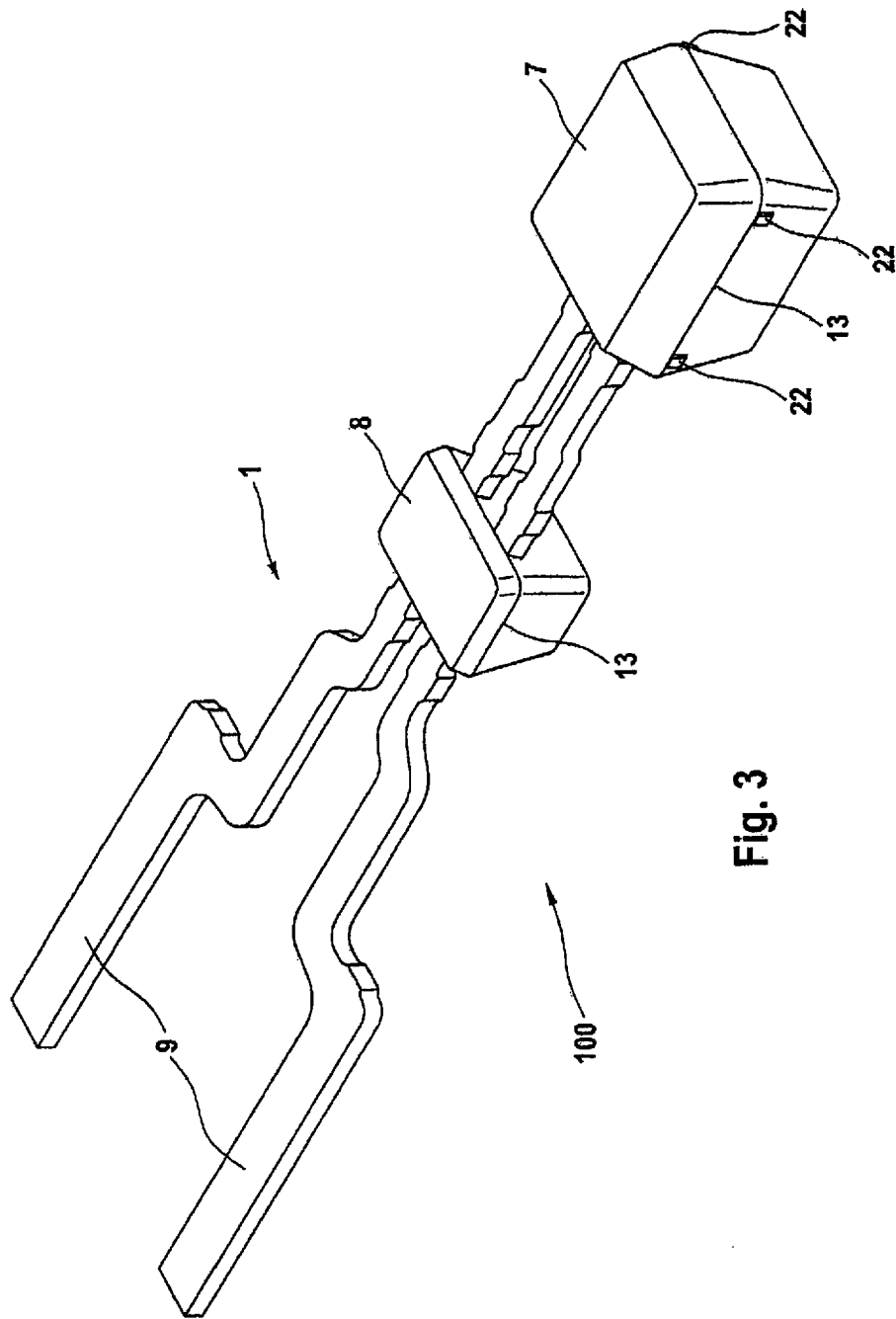

FIG. 3 illustrates an exemplary sensor element 100 comprising a basic element 1 with contacting legs 9 and a first 7 and second 8 housing formed by injection molding. The first housing 7 comprises a probe element, not shown, an ASIC die and a magnetic means. The second housing 8 comprises, for example, an electronic protection element or is "empty" in an alternative exemplary embodiment, thus only consists of the encapsulation molded part of the basic element and the injection molded compound itself. In this arrangement, this second housing 8 is also used for mechanical load relief, especially strain relief with respect to the contacting legs 9. In addition, FIG. 3 shows the holding devices 13 which can be embraced from the outside, according to the example formed as rounded edge, of the first and second housings. The holding device 13 of the first housing 7 also comprises on two opposite sides in each case two locating noses 22.

Figure 4:
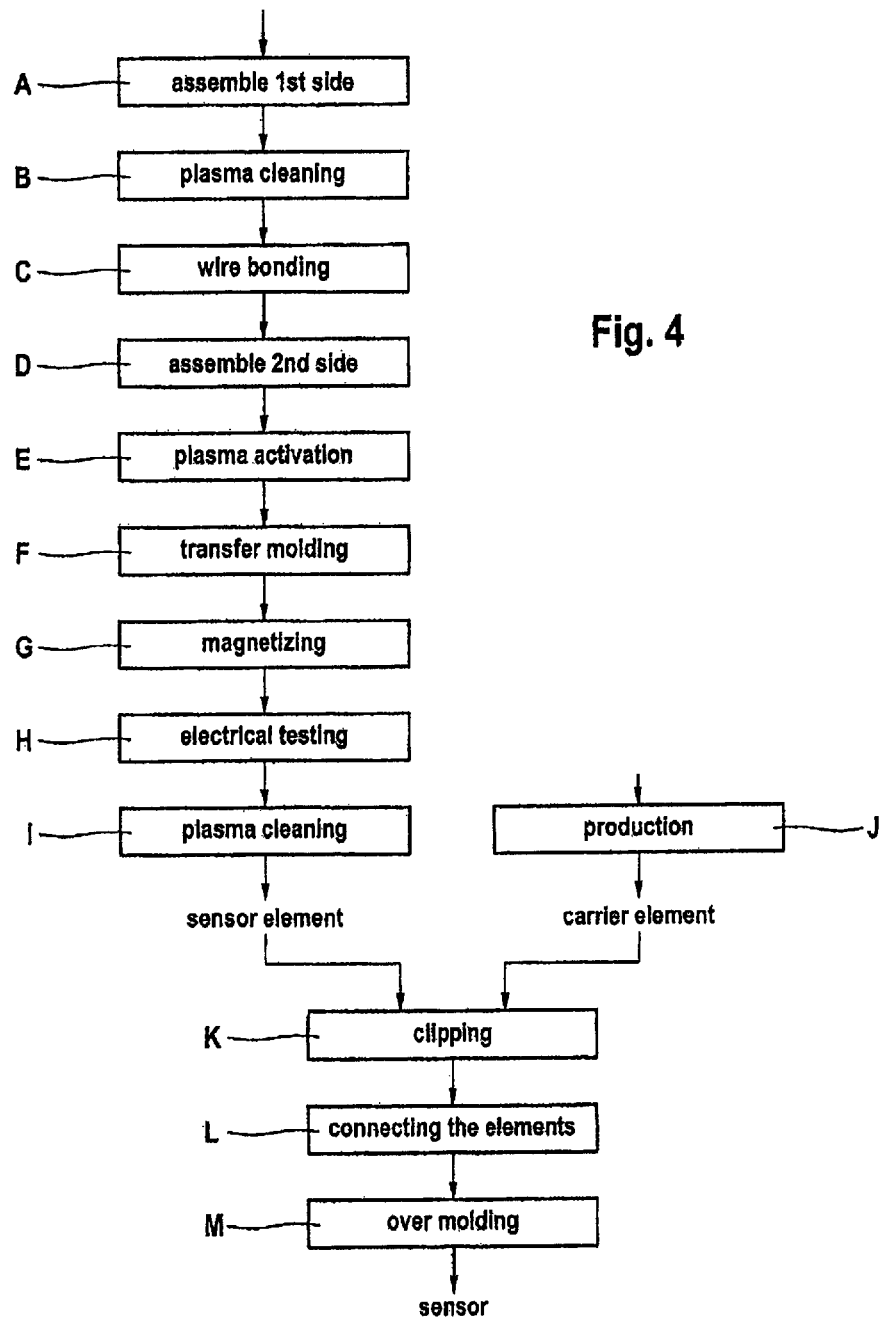
FIG. 4 shows an exemplary flow chart of the method for manufacturing a sensor.

FIG. 4 illustrates an exemplary method for manufacturing a sensor in a flow chart. In this figure, method steps A to I relate to the manufacture of an exemplary sensor element, method step J relates to the manufacture of an exemplary support element and steps K and L relate to the manufacture of the sensor.

In this context, the basic element or lead frame, respectively, is fitted with components from a first side in a method step A "assemble 1st side". In this method step A, on part of the first side of the basic element, a first, electrically insulating and relatively thermally conductive adhesive is applied, according to the example, to the first side of a carrier base, which is also called "adhesive dispensing". After that, an ASIC die and a probe element are arranged or bonded on this first side, which can also be called "die attaching". After that, the first adhesive is cured in a furnace, "curing".

Following this, a plasma cleaning process "plasma cleaning" is carried out in method step B. This is used for preparing for an electrical contacting method.

This is followed by a contacting process C, "wire bonding", of the components arranged on the first side of the basic element or of the probe element and of the ASIC die, according to the example in accordance with a ball-stitch-on-ball bonding method with AU wire.

After that, an assembly process D of the second side of the basic element takes place, "assemble 2nd side". In this process, part of the second side of the basic element is wetted, by way of example, with a second adhesive which is electrically conductive, "adhesive dispensing", after which a magnetic means and an electronic protection element are arranged mutually spaced-apart on the second side, to improve the EMC characteristics of the sensor element. After that, the second adhesive is cured in a furnace, "curing".

After the assembly processes, a plasma activation process E "plasma activation" is carried out or, respectively, the sensor element is subjected to this plasma activation process.

Following this, a first and a second housing are formed in a plastic injection molding process F, "transfer molding", which housings comprise the components previously arranged on the basic element and which have in each case a rounded edge, which can be embraced from the outside, as holding device. The injection molding of the housings is cured in a furnace, "post mold curing".

This is followed by a magnetization process G of the magnetic means, after which an electrical test method H, "electrical testing", of the sensor element is carried out in which the operability of the probe element in interaction with the magnetic means and the operablity of the ASIC die is checked.

Following this, the sensor element is subjected to a plasma cleaning process I "plasma cleaning", which reduces the susceptibility to corrosion of the sensor element and of the exposed electrical contacts of the sensor element, respectively. As a result, no additional electroplating process, for example tin-plating or nickel-plating of the exposed electrical contacts, needs to be carried out.

As an alternative, there is no additional treatment of the sensor element for protection against corrosion at all, but suitable packaging, for example by means of an air-tight packaging or by means of an air-tight bag, of the sensor element.

In method step J, an exemplary support element, "carrier element", which is attached to a metal frame, is manufactured in an injection molding process. During this process, a positioning element and two clamping devices are formed.

After that, the sensor element and the support element are mechanically joined to one another in a common method step K "clipping", by the first and second housings of the sensor element being clipped positively with the holding devices thereof into the clamping devices of the support element.

Following this, the sensor element and the support element and external terminals are jointly connected to one another electrically or contacted, respectively, "connecting the elements", in a common method step L. In this process, one contacting leg of the sensor element and one cable strand or one plug pin/terminal of an external terminal is in each case accommodated by a contact terminal, for example formed in the manner of a basket, of the support element and jointly crimped together with the latter.

After that, the elements connected to one another, that is to say the sensor element and the support element, are jointly encapsulation molded in method step M. In this process, the connected elements are placed into an injection molding tool, or positioned in the latter, by means of the positioning element of the support element, after which a common injection molding process "over molding" is carried out for forming the sensor housing, in which, for example, the first and the second housing of the sensor element are jointly encapsulation molded with the support element by means of an over molding injection molding process.

Figure 5:
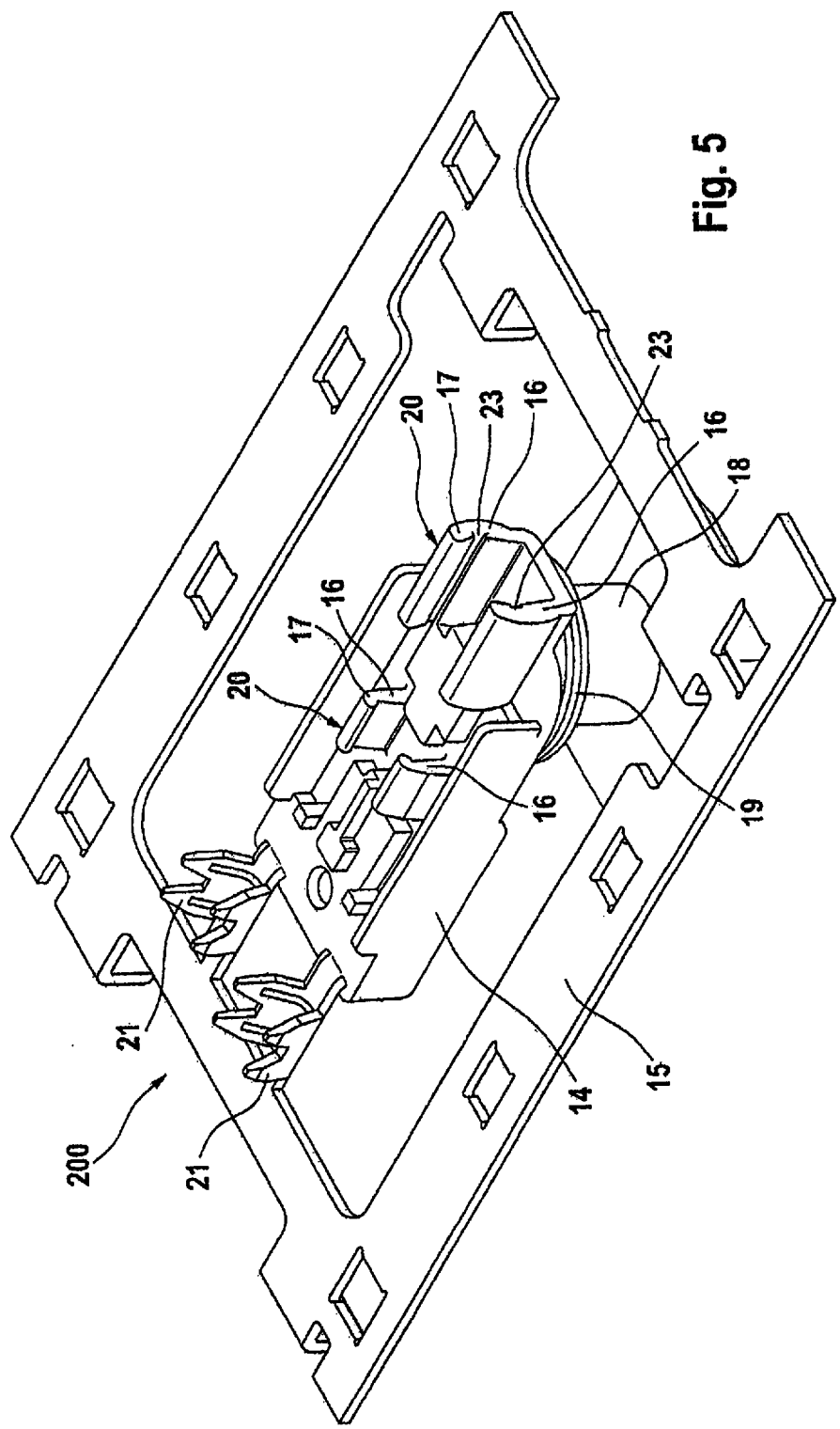
FIG. 5 shows an exemplary embodiment of a support element with two clamping devices and a positioning element with integrated fusible ribs.

FIG. 5 shows an exemplary embodiment of a carrier element 200, which comprises a metal frame 15 and a carrier device 14. The carrier device 14 has a positioning element 18 with integrated fusible ribs 19, and also has two clamping devices 20 which in each case have two flexible legs 16 with rounded portions 17 at their ends or heads, respectively. As a result of these rounded portions, a holding device of the sensor element can be accommodated by or clipped into the clamping device 20 in a relatively easy and precise manner. The lower, larger clamping device also has on the inside of the flexible legs 16 in each case a groove 23. The support element 200 also has two basket-shaped contact terminals 21 of metal for electrically contacting in each case one contacting leg of the sensor element and one cable strand or one plug-in pin or another connecting means of an external electrical connection.

FIG. 6 shows an exemplary connection between a sensor element 100 and a support element 200. In this arrangement, FIG. 6 a) shows an exemplary arrangement of both elements 100, 200 in an already mechanically connected state. FIGS. 6 b) to d) illustrate in three steps the clipping of the holding device 13 of the second housing 8 into a clamping device 20 of the support element with two flexible legs 16. The two legs 16 have at their ends in each case rounded portions 17. FIGS. 6 e) to g) correspondingly show by way of example an accommodation or the clipping of the first housing 7 of the sensor element 100 into the clamping device 20. In this context, the holding device 13 of the first housing 7 has a rounded edge and on two opposite sides in each case two locating noses 22 for precise positioning. In this arrangement, these locating noses 22 dip or lock into in each case a groove 23 on the inside of the flexible legs 16 of the clamping device 20.

The arrangement shown in FIG. 6a) shows the sensor element 100 connected to the support element 200. In this arrangement, the first and second housings 7, 8 of the sensor element are clipped with a respective holding device into clamping devices 20 of the support element. Contacting legs 9 of the basic element 1 of the sensor element are held by basket-shaped contact terminals 21 of the support element. The support element 200 moreover has a positioning element 18 with integrated fusible ribs 19 for positioning the arrangement in an injection molding tool, not shown.

What is claimed:

1. A method for manufacturing a sensor comprising:
   at least partially encapsulating a sensor element using a first encapsulation molding process to form a sensor housing;
   coupling the sensor element to a support element; and
   at least partially encapsulating the sensor housing and the support element together using a second encapsulation molding process.

2. The method of claim 1, wherein the coupling further comprises connecting the sensor element to the support element using a holding device of the sensor element.

3. The method of claim 2, wherein the coupling further comprises holding the holding device of the sensor element using at least one clamping device of the support element.

4. The method of claim 2, wherein the coupling further comprises embracing the holding device from an outside of the holding device.

5. The method of claim 1, wherein the coupling occurs before the encapsulating of the sensor housing and the support element.

6. The method of claim 1, further comprising positioning the support element in an injection molding tool using at least one positioning element after the coupling of the sensor element to the support element.

* * * * *